United States Patent
Tachibana

(10) Patent No.: US 7,050,881 B2
(45) Date of Patent: May 23, 2006

(54) DATA OUTPUT PROCESSOR AND METHOD OF MANUFACTURING A SEMICONDUCTOR DEVICE

(75) Inventor: Hiroaki Tachibana, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/007,265

(22) Filed: Dec. 9, 2004

(65) Prior Publication Data

US 2005/0209727 A1   Sep. 22, 2005

(30) Foreign Application Priority Data

Mar. 19, 2004   (JP) .............................. 2004-081718

(51) Int. Cl.
  *G06F 19/00* (2006.01)
(52) U.S. Cl. ..................... 700/121; 438/618; 716/10
(58) Field of Classification Search ................ 700/121; 438/618, 622, 637–638; 716/10, 2
  See application file for complete search history.

(56) References Cited

U.S. PATENT DOCUMENTS

| | | | |
|---|---|---|---|
| 6,499,135 B1 * | 12/2002 | Li et al. | 716/19 |
| 6,528,879 B1 * | 3/2003 | Sakamoto et al. | 257/729 |
| 2004/0217484 A1 * | 11/2004 | Ireland | 257/774 |

FOREIGN PATENT DOCUMENTS

JP   2003-277985   10/2003

* cited by examiner

*Primary Examiner*—Kidest Bahta
(74) *Attorney, Agent, or Firm*—Young & Thompson

(57) ABSTRACT

A data output processor is employed when forming a conductive pattern on a layer formed with a plurality of recesses by filling the plurality of recesses with a conductive material by an electrolytic plating. The data output processor includes a parameter input receiving unit which receives a proportion of a recess with a width not exceeding a first reference width in the layer with respect to that layer, an arithmetic processor which calculates an integrated current amount necessary for filling the plurality of recesses with the conductive material in accordance with the proportion, and an output unit which outputs the integrated current amount.

7 Claims, 5 Drawing Sheets

DATA OUTPUT PROCESSOR AND METHOD OF MANUFACTURING A SEMICONDUCTOR DEVICE

This application is based on Japanese patent application No.2004-081718, the content of which is incorporated hereinto by reference.

BACKGROUND OF THE INVENTION

1. Field of the Invention

The present invention relates to a data output processor to be used when forming a conductive layer by an electrolytic plating in a layer formed with a plurality of recesses or trenches, and to a method of manufacturing a semiconductor device including the conductive layer formed by the electrolytic plating.

2. Description of the Related Art

In the field of a semiconductor device including a copper interconnect, the progressive micronization of an interconnect pattern resultant from the downscaling of the design rule has provoked an increasing demand for a better filling performance of a via and a trench in a copper plating process. Concurrently, reduction in thickness of a film to be deposited is also being required in all the design rules, for reducing a wafer diffusion cost and improving a production capacity. Accordingly, these two types of requirements have to be satisfied, in a copper (hereinafter designated by Cu) plating process.

In this respect, JP-A Laid-open patent publication No.2003-277985 discloses a plating process that causes a bottom-up growth in which a plated layer located at a bottom portion of a trench or a recess can predominantly grow, to cope with the micronization of a via or a trench.

However, forming a plated layer by the bottom-up growth process in a fine trench, a thicker film is finally formed on the trench than a plane region, which is called an overplating phenomenon. This leads to another drawback that a film thickness of region other than where the thicker film is formed becomes too thin. For example, when a fine pattern and a pattern including a wide interconnect coexist in a same layer, a thicker layer is formed on the fine pattern, while a layer formed on the wide interconnect often becomes so thin that the wide interconnect trench is not completely filled. Accordingly, normally a Cu plating thickness has to be set with a sufficient positive allowance, so as to completely fill in the wide interconnect trench. This inevitably leads to a lowered productivity in the Cu plating process. Besides, since an excessively thick plated layer is formed on the fine pattern, an increase of Cu-CMP (chemical mechanical polishing) slurry cost and the like raises an overall diffusion cost.

Further, although an additive called a leveller may be employed for restraining such overplating phenomenon, this causes various problems such as an additional cost increase from consumption and administration of the leveller, emergence of a void in a grain triple point after annealing, degradation of filling performance, and so on.

SUMMARY OF THE INVENTION

According to the present invention, there is provided a data output processor to be used for forming a conductive pattern on a layer formed with a plurality of recesses by filling the plurality of recesses with a conductive material by an electrolytic plating, comprising: a receiving unit which receives a proportion of a fine recess with a width not exceeding a first reference width in the layer with respect to the layer; an arithmetic processor which calculates an integrated current amount to be supplied for filling the plurality of recesses with the conductive material in accordance with the proportion; and an output unit which outputs the integrated current amount.

According to the present invention, there is provided a method of manufacturing a semiconductor device including forming a conductive pattern on a layer formed with a plurality of recesses by filling the plurality of recesses with a conductive material by an electrolytic plating, comprising: acquiring a proportion of a fine recess having a width not exceeding a first reference width in the layer with respect to the layer; determining an integrated current amount to be supplied for filling plurality of recesses with the conductive material in accordance with the proportion; and forming a conductive pattern by an electrolytic plating based on the integrated current amount determined in the determining the integrated current amount.

Here, the integrated current amount is a product of multiplying a current value to be supplied to a plating solution by a duration of time, when performing an electrolytic plating. Alternatively, an integrated current density may be employed, which is a product of multiplying a current density, i.e. a current value per unit area of the plating solution, by a duration of time.

Obtaining in advance an integrated current amount necessary for achieving an appropriate film thickness as above, when performing the electrolytic plating, eliminates the need to form an excessively thick plated layer. Therefore, a productivity in the plating process can be improved. With the above processor and method it is capable of restraining a diffusion cost increase due to an increase of a slurry cost for a CMP process.

FIG. 1 is a line graph showing a film thickness of a Cu-plated layer on an interconnect trench, measured upon forming the Cu-plated layer on a layer that includes interconnect trenches of a different interconnect width. As is apparent in FIG. 1, on the interconnect trenches including an interconnect of 5 μm or wider the Cu-plated layer is thinner (15000 to 18000 Å), while the Cu-plated layer becomes prominently thicker (approx. 25000 Å) on the interconnect trenches including an interconnect of 3 μm or narrower, though a plating condition is the same. Accordingly, the first reference width may be set at 3 μm.

The data output processor of the present invention may further includes a storage unit which stores a plurality of data sets including X and I with respect to different X values, where X represents a proportion of the fine recess formed in a layer with the fine recess and a wide recess wider than the first reference width with respect to the layer, and I represents an integrated current amount necessary for forming a conductive layer having a predetermined film thickness on the wide recess; wherein the arithmetic processor calculates the integrated current amount with reference to the storage unit.

Such data can be obtained through performing the electrolytic plating under a same condition on a plurality of wafers having a different fine pattern proportion with respect to the layer, and storing a film thickness of the plated layers thus formed in correlation with the respective fine pattern proportion.

With this structure, it is capable of determining an appropriate integrated current amount in accordance with a fine pattern proportion with respect to a target layer, so as to form a plated layer of a desired film thickness, thereby resulting in an improved productivity.

Accordingly, the present invention provides a technique of forming an electrolytically plated layer having an appropriate film thickness in a layer formed with a plurality of recesses.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
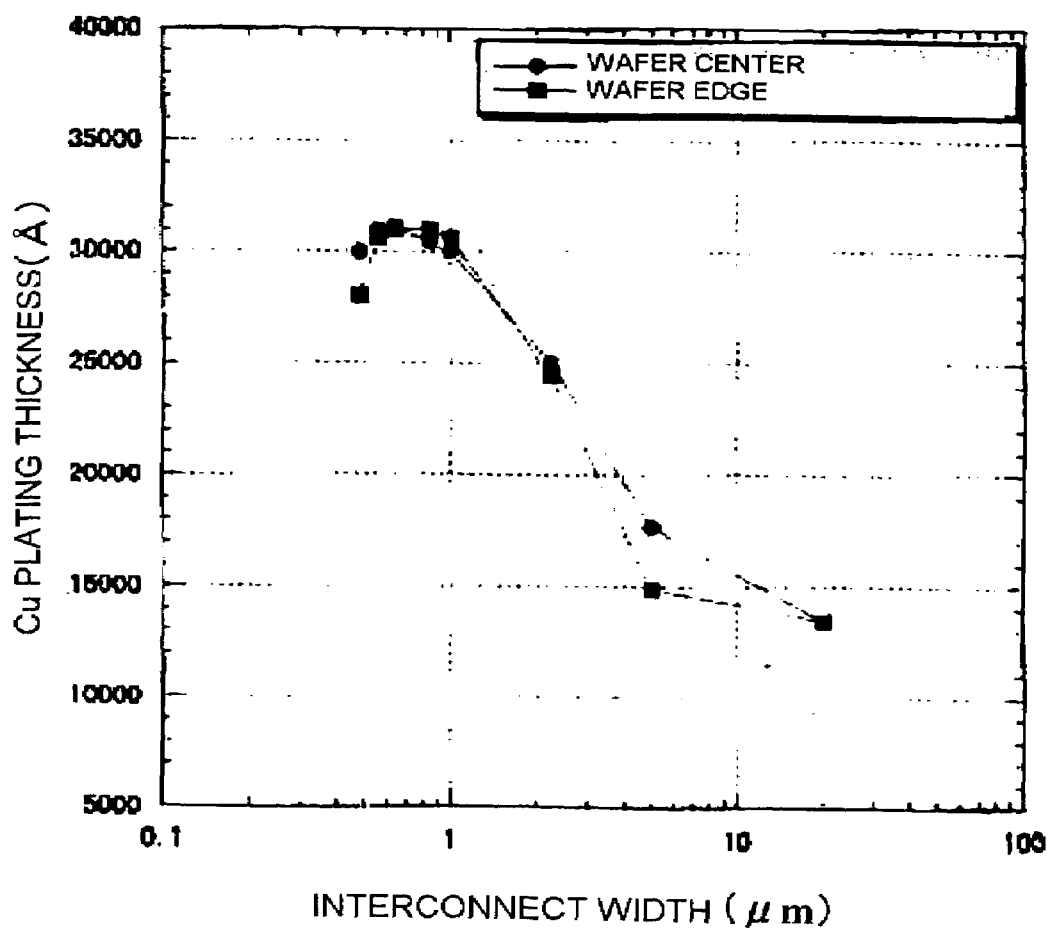
FIG. 1 is a line graph showing a relation between an interconnect width and a Cu-plated layer thickness.
Figure 2:
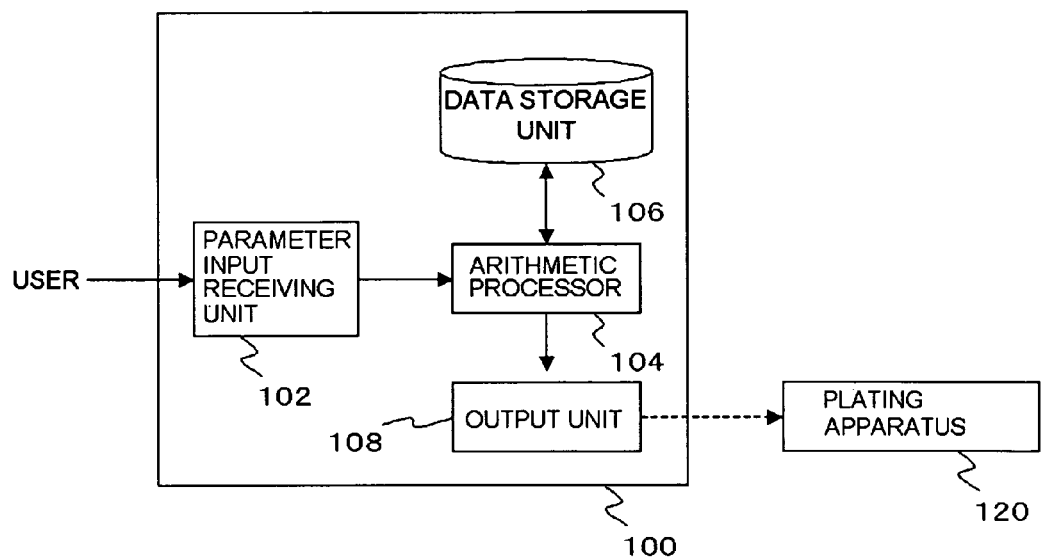
FIG. 2 is a block diagram showing a configuration of a data output processor according to an embodiment of the present invention.

FIG. 2 is a block diagram showing a configuration of a data output processor according to an embodiment of the present invention.

The data output processor 100 according to this embodiment is designed to output a plating condition by which a plated layer is formed to be a desired film thickness, when performing an electrolytic plating to form a plated layer on a layer formed with a plurality of recesses such as wide interconnect trenches and fine patterns.

The data output processor 100 includes a parameter input receiving unit 102, an arithmetic processor 104, a data storage unit 106, and an output unit 108.

The parameter input receiving unit 102 receives an input of a parameter such as a proportion of a fine pattern in a target layer, a desired film thickness of a plated layer and the like. Here, the film thickness of a plated layer means a film thickness of a layer to be plated on a wide interconnect trench. Also, a proportion of a fine pattern against a layer may be obtained based on an area of aperture of a reticle. In this embodiment, a recess with a width not exceeding 3 µm is defined as a fine pattern. The proportion of a fine pattern against a layer is calculated based on a proportion of such fine pattern included in a reticle.

The data storage unit 106 stores a relation between a fine pattern proportion and an integrated current amount magnification with respect to each layer. Here, the integrated current amount magnification means a magnification ratio of an integrated current amount with respect to a reference integrated current amount, which is an amount necessary for forming a plated layer of a predetermined unit film thickness, on a blanket wafer (a wafer on which a recess is not formed).

A relation between a proportion of a fine pattern in a layer and an integrated current amount magnification may be obtained as follows. In this embodiment, the plated layer is assumed to be a Cu-plated layer. Also, a wafer hereinafter means not only a single body semiconductor substrate such as a silicon or a gallium arsenide, but also a semiconductor substrate provided with a semiconductor device or an interconnects and the like.

Firstly, a seed Cu layer (film thickness $S_0$ (for example 100 nm)) is formed on a blanket wafer by sputtering or the like, and a Cu-plated layer is formed on the seed Cu layer with an integrated current amount $I_0$ (for example 800 amp·sec). Upon defining a total Cu film thickness as $T_0$, a film thickness $P_0$ of the Cu-plated layer can be obtained as $P_0=T_0-S_0$. The film thickness $P_0$ of the Cu-plated layer obtained in this case is utilized as the unit film thickness.

Then a similar process is carried out to form a seed Cu layer and a Cu-plated layer on another wafer formed with a predetermined proportion of fine pattern, and a film thickness $P_n$ of the Cu-plated layer is calculated. In this process, it is desirable to use the same plating apparatus for forming the Cu-plated layer, and to apply the same conditions, such as the current value to be supplied to the plating solution, the plating time, the plating flow rate, the wafer rotation and so on, as those applied to the blanket wafer. Through such arrangement, a data set on a plurality of wafers formed with a different fine pattern proportion can be obtained.

Figure 3:
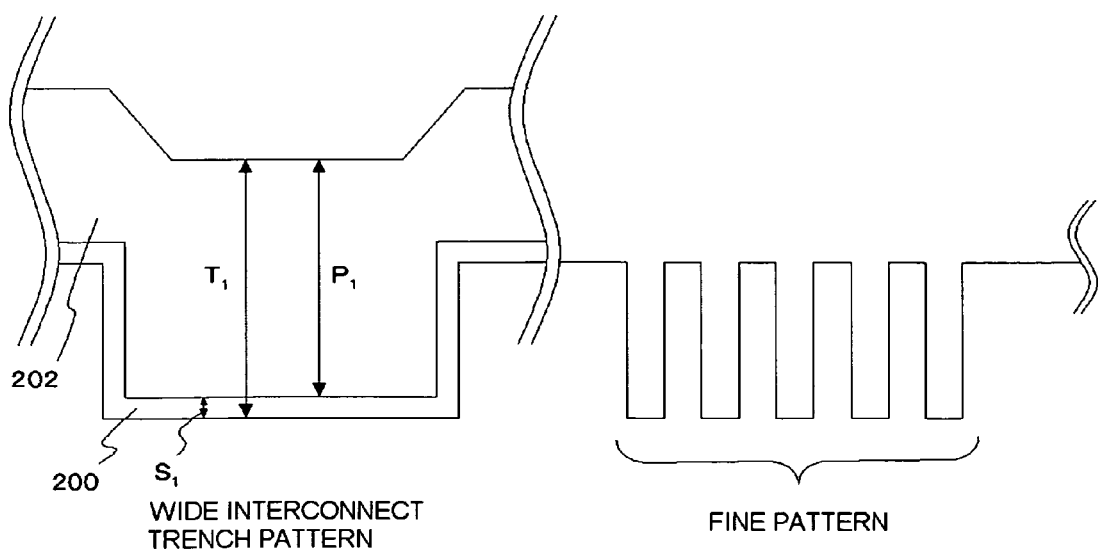
FIG. 3 is a schematic cross-sectional view showing a layer with a wide interconnect trench and a fine pattern.

FIG. 3 is a schematic cross-sectional view showing a layer formed with a wide interconnect trench and a fine pattern. Here, the wide interconnect trench may be defined as an interconnect trench with a width of 10 µm, for example.

In the wide interconnect trench, the interconnect is formed through the following processes. Firstly a seed Cu layer 200 (film thickness $S_1$) is formed by sputtering or the like. Then, a Cu-plated layer 202 is formed on the seed Cu layer 200 with an integrated current amount $I_0$. Here, a film thickness $P_1$ of the Cu-plated layer 202 can be obtained by deducting a film thickness $S_1$ of the seed Cu layer 200 from a film thickness $T_1$ of a plane portion of the wide interconnect trench.

Through the foregoing steps, the film thickness of the Cu-plated layer on a plurality of wafers formed with a fine pattern in a different proportion can be respectively acquired. The integrated current amount magnification of each wafer with respect to the blanket wafer used as the reference can be obtained as $P_0/P_n$. The integrated current amount magnification of the example shown in FIG. 3 can be obtained as $P_0/P_1$.

Figure 4:
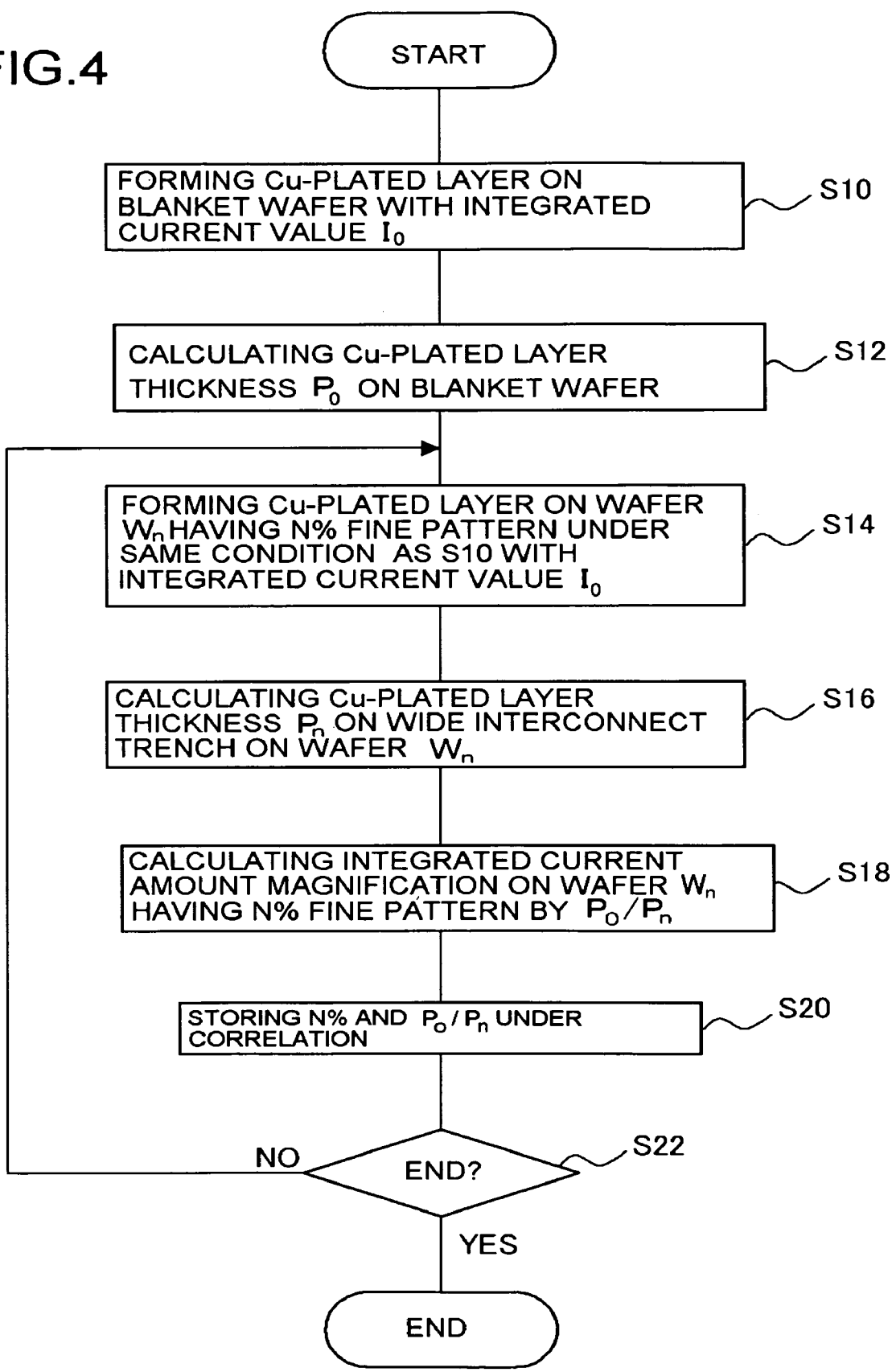
FIG. 4 is a flowchart showing an acquisition process of data on a relation between a proportion of a fine pattern in a wafer and an integrated current amount magnification.

FIG. 4 is a flowchart showing process for obtaining a data set on a relation between a proportion of a fine pattern in a wafer and an integrated current amount magnification.

After forming a seed Cu layer (not shown), a Cu-plated layer is formed on the seed Cu layer with an integrated current amount $I_0$ (S10). Then a film thickness $P_0$ of the Cu-plated layer on a blanket wafer is calculated (S12). Another Cu-plated layer is then formed on a wafer $W_n$ formed with a fine pattern in a proportion of N % with an integrated current amount $I_0$, under a same condition as S10 (S14). Then a film thickness $P_n$ of the Cu-plated layer on a wide interconnect trench in the wafer $W_n$ is calculated (S16). After that, an integrated current amount magnification in the wafer $W_n$ formed with a fine pattern in a proportion of N % is calculated according to $P_0/P_n$ (S18). Then the proportion N % of the fine pattern and the integrated current amount magnification $P_0/P_n$ are stored as correlated values (S20). In case of acquiring additional data on an integrated current amount magnification on another wafer formed with a fine pattern in a different proportion (NO of S22), the process returns to the step S14 to then repeat similar steps. The foregoing steps provide a data set showing a relation between a fine pattern proportion on a wafer and a corresponding integrated current amount magnification.

According to this embodiment, it is desirable to form a plated layer using a same plating apparatus and under a same plating condition, when acquiring a data set showing a relation between a fine pattern proportion on a wafer and a corresponding integrated current amount magnification. With such conditions, it is capable of obtaining a data set that does not depend on other conditions, which enables achieving a plated layer of a desired film thickness simply by adjusting an integrated current amount magnification to a desired value, when controlling a film thickness of the plated layer.

Figure 5:
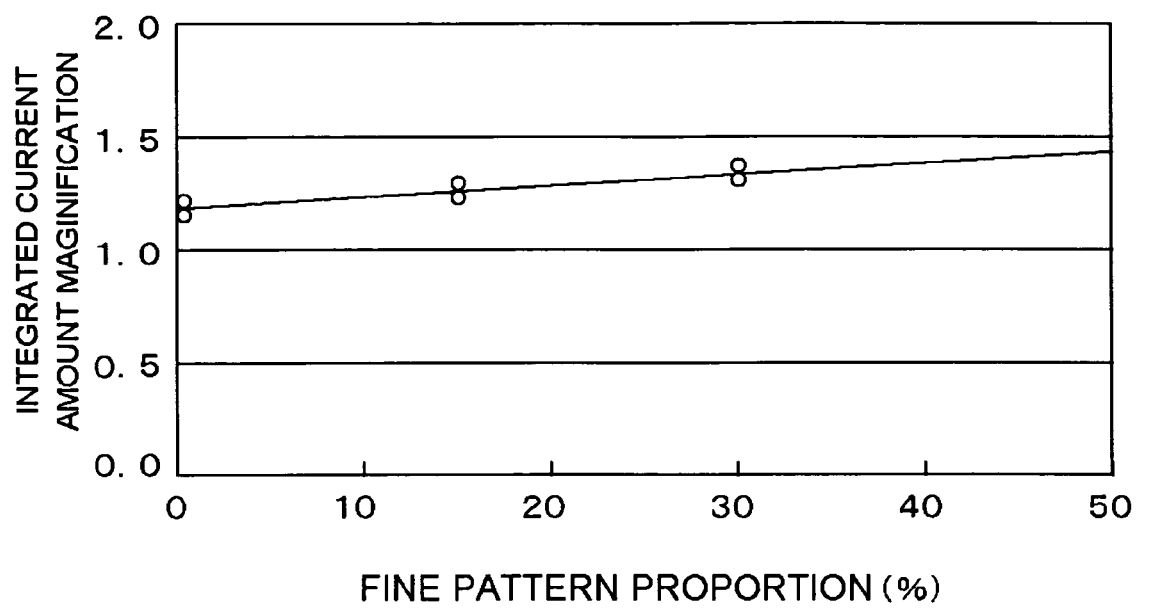
FIG. 5 is a line graph in which the data stored in the data storage unit is plotted.

FIG. 5 is a line graph in which the data stored in the data storage unit is plotted.

Referring to FIG. 5, the horizontal axis represents a proportion (%) of a fine pattern in each layer. The vertical axis represents an integrated current amount magnification for a wide interconnect trench with respect to a layer on which a fine pattern is not formed as the reference. Here, in the layer formed with a 15% of fine pattern for example, the integrated current amount magnification is indicated as approx. 1.3. Also, in the layer formed with a 30% of fine pattern, the integrated current amount magnification is indicated as approx. 1.4.

Referring back to FIG. 2, when the parameter input receiving unit 102 receives an input of a parameter, the arithmetic processor 104 refers to the data storage unit 106 to thereby acquire an integrated current amount magnification corresponding to a proportion of a fine pattern in a target layer. The arithmetic processor 104 may then calculate an integrated current amount necessary for forming a plated layer having a film thickness $P_0$ in each layer, based on a relation between the fine pattern proportion and the integrated current amount magnification. For example, in a wafer where an integrated current amount magnification is calculated as $P_0/P_1$, an integrated current amount $I_1$ necessary for forming a Cu-plated layer having a film thickness of $P_0$ can be obtained as $I_1=I_0 \times P_0/P_1$. Accordingly, in a wafer where an integrated current amount magnification is $P_0/P_1$, an integrated current amount $I_m$ necessary for forming a Cu-plated layer having a film thickness of $P_m$ can be obtained as $I_m=(P_m/P_0) \times (P_0/P_n)=P_m/P_n$.

The output unit 108 then outputs an integrated current amount calculated by the arithmetic processor 104.

Figure 6:
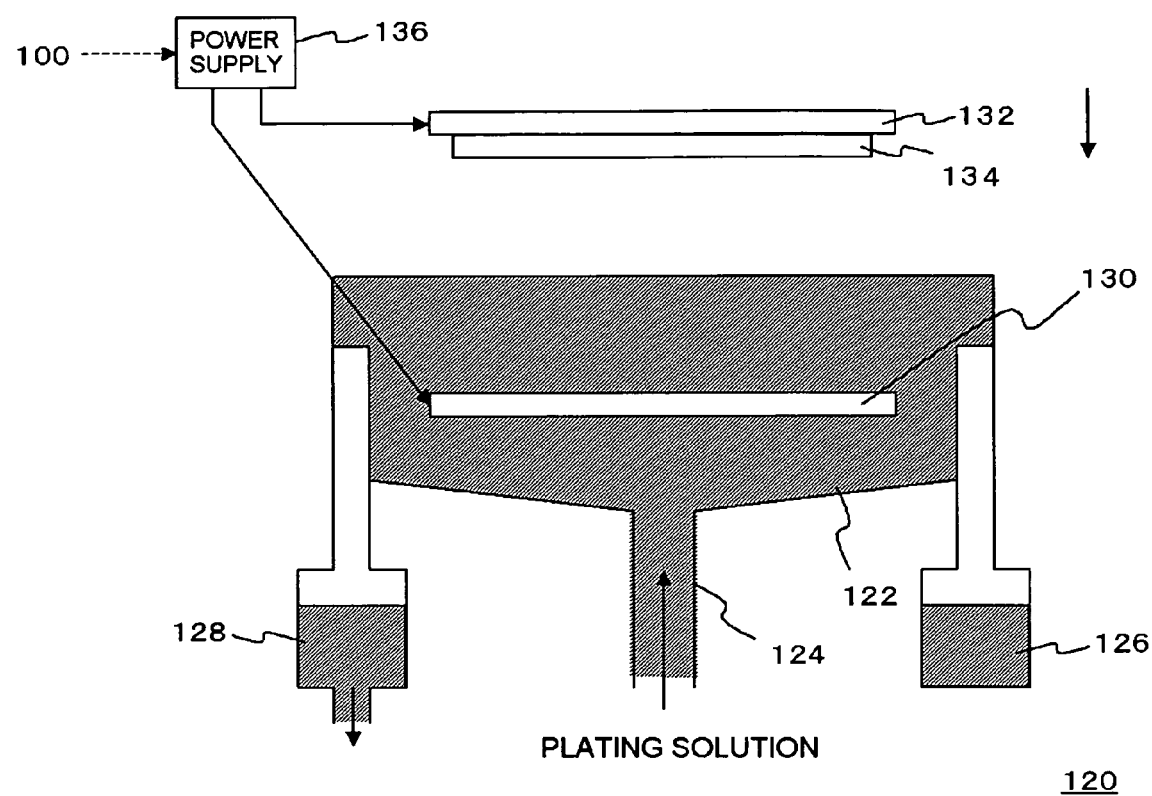
FIG. 6 is a schematic diagram showing a configuration of a plating apparatus.

FIG. 6 is a schematic diagram showing a configuration of a plating apparatus.

The plating apparatus 120 includes a plating tank 122, a solution inlet 124, a solution chamber 126, and a solution outlet 128. The plating tank 122 is provided therein with an anode electrode 130. And a cathode electrode 132 is disposed above the plating tank 122. Here, the cathode electrode 132 is movably installed so as to move close to and away from the anode electrode 130, and is also rotatable. The cathode electrode 132 is also designed to hold a semiconductor device 134. To be more detailed, the cathode electrode 132 holds the semiconductor device 134 such that it achieves an electrical contact with a seed metal layer of the semiconductor device 134.

Also, the plating solution discharged from the outlet 128 is deposited in a collection chamber, which is not shown in FIG. 6, where a temperature of the plating solution can be controlled as desired. Then the plating solution is filtered through a filter unit or the like, to be introduced into the plating tank 122 through the solution inlet 124. The plating solution is circulated as such.

Under such configuration, a current is supplied from a power supply 136 to the cathode electrode 132 and the anode electrode 130 so as to perform an electrolytic plating, to thereby form a plated layer on the semiconductor device 134. An operator of the plating apparatus 120 may control a current value to be supplied from the power supply 136 and/or a plating time, based on an integrated current amount output by the arithmetic processor 104 of the data output processor 100.

As described throughout the foregoing passages, the data output processor 100 according to this embodiment outputs an appropriate integrated current amount based on a proportion of a fine pattern in a layer which is the target of the electrolytic plating process, to thereby facilitate achieving a desired film thickness of the plated layer. Such processor eliminates the need to form an excessively thick plated layer, thereby improving a productivity in the plating process. With the processor, it is capable of restraining a diffusion cost increase due to an increase of a slurry cost for a CMP process.

Although the present invention has been described byway of exemplary embodiments, it should be understood that various changes and substitutions may further be made by those skilled in the art without departing from the scope of the present invention, which is defined by the appended claims.

To cite a few examples, the plating apparatus 120 may be constituted such that a current value to be supplied by the power supply 136 or a plating time is automatically controlled based on an integrated current amount output by the output unit 108 of the data output processor 100. This enables automatic formation of a plated layer having a desired film thickness without involving an operator.

It is apparent that the present invention is not limited to the above embodiment, that may be modified and changed without departing from the scope and spirit of the invention.

What is claimed is:

1. A data output processor to be used for forming a conductive pattern on a layer formed with a plurality of recesses by filling said plurality of recesses with a conductive material by supplying a current to a plating solution so as to perform an electrolytic plating, comprising:
    a receiving unit which receives a proportion of a fine recess with a width not exceeding a first reference width in said layer with respect to said layer;
    an arithmetic processor which calculates an integrated current amount to be supplied to said plating solution for filling said plurality of recesses with said conductive material in accordance with said proportion; and
    an output unit which outputs said integrated current amount.

2. The data output processor as set forth in claim 1, further comprising:
    a storage unit which stores a plurality of data sets including X and I with respect to different X values, where X represents a proportion of said fine recess formed in a layer with said fine recess and a wide recess wider than said first reference width with respect to said layer, and I represents an integrated current amount necessary for forming a conductive layer having a predetermined film thickness on said wide recess;
    wherein said arithmetic processor calculates said integrated current amount with reference to said storage unit.

3. A computer program for causing a computer to control a process including forming a conductive pattern on a layer formed with a plurality of recesses by filling said plurality of recesses with a conductive material by supplying a current to a plating solution so as to perform an electrolytic plating, comprising causing said computer to serve as:

a parameter input receiving unit which receives a proportion of a fine recess with a width not exceeding a first reference width in said layer with respect to said layer;

an arithmetic processor which calculates an integrated current amount to be supplied to said plating solution necessary for filling said plurality of recesses with said conductive material in accordance with said proportion; and an output unit which outputs said integrated current amount.

4. A method of manufacturing a semiconductor device including forming a conductive pattern on a layer formed with a plurality of recesses by filling said plurality of recesses with a conductive material by supplying a current to a plating solution so as to perform an electrolytic plating, comprising:

acquiring a proportion of a fine recess having a width not exceeding a first reference width in said layer with respect to said layer;

determining an integrated current amount to be supplied to said plating solution for filling said plurality of recesses with said conductive material in accordance with said proportion; and forming a conductive pattern by an electrolytic plating based on said integrated current amount determined in said determining said integrated current amount.

5. The method as set forth in claim 4, further comprising:

acquiring a plurality of data sets including X and I with respect to different X values, where X represents a proportion of said fine recess formed in a layer that includes said fine recess and a wide recess wider than said first reference width with respect to said layer, and I represents an integrated current amount necessary for forming a conductive layer having a predetermined film thickness on said wide recess;

wherein said determining said integrated current amount includes determining said integrated current amount with reference to said data set acquired in said acquiring said data set.

6. The method as set forth in claim 4, wherein said forming said conductive pattern includes controlling a plating time based on said integrated current amount.

7. The method as set forth in claim 5, wherein said forming said conductive pattern includes controlling a plating time based on said integrated current amount.

* * * * *